US007038364B2

(12) United States Patent
Yamaguchi et al.

(10) Patent No.: US 7,038,364 B2
(45) Date of Patent: May 2, 2006

(54) PROCESSOR AND METHOD FOR PROCESSING

(75) Inventors: Masonori Yamaguchi, Hyogo (JP); Masaki Yoshioka, Hyogo (JP)

(73) Assignee: Ushio Denki Kabushiki Kaisya, Tokyo (JP)

( * ) Notice: Subject to any disclaimer, the term of this patent is extended or adjusted under 35 U.S.C. 154(b) by 0 days.

(21) Appl. No.: 09/946,331

(22) Filed: Sep. 6, 2001

(65) Prior Publication Data
US 2003/0042832 A1    Mar. 6, 2003

(51) Int. Cl.
*H01J 17/26* (2006.01)
(52) U.S. Cl. .......................... 313/231.01; 313/231.31; 313/634; 313/637; 445/38
(58) Field of Classification Search ............... 313/634, 313/637, 231.01, 231.31; 445/59, 42, 38
See application file for complete search history.

(56) References Cited

U.S. PATENT DOCUMENTS

| 5,470,266 | A | * | 11/1995 | Stanley et al. ............... 445/59 |
| RE35,203 | E | | 4/1996 | Wakalopulos |
| 6,052,401 | A | * | 4/2000 | Wieser et al. ................ 372/74 |
| 6,372,646 | B1 | * | 4/2002 | Ohmi et al. ................ 438/689 |
| 6,450,116 | B1 | * | 9/2002 | Noble et al. ............. 118/723 R |
| 6,504,903 | B1 | * | 1/2003 | Kondo et al. ................ 378/119 |

* cited by examiner

Primary Examiner—Mariceli Santiago
Assistant Examiner—Anthony Perry
(74) Attorney, Agent, or Firm—Oblon, Spivak, McClelland, Maier & Neustadt, P.C.

(57) ABSTRACT

This invention provides a processing device allowing a plurality of types of processing including electron beam processing to be carried out on a substance disposed in a processing chamber, and processing methods that use such a processing device and allow prescribed processing to be carried out in an advantageous way, the processing device has a processing chamber provided with a support member, an electron beam source provided in the processing chamber and emits an electron beam toward the substance supported by the support member, and an emission gas supply system provided in the processing chamber and supplies an emission gas that emits UV light upon being subjected to an electron beam, moreover, a low pressure system that reduces the pressure in the processing chamber and a process gas supply system that supplies a process gas are preferably provided in the processing chamber, and in the processing methods, such a processing device is used, and by adjusting the pressure in the processing chamber, electron beam processing, UV processing and specific processing using the process gas can be carried out either separately or simultaneously.

1 Claim, 3 Drawing Sheets

PROCESSOR AND METHOD FOR PROCESSING

BACKGROUND OF THE INVENTION

1. Field of the Invention

The present invention relates to a processing device and processing method, and more particularly to a processing device and processing method for processing a substance by using an electron beam emitted from an electron beam source.

2. Description of the Related Art

As processing methods currently known for subjecting a substance to be processed such as a substance made of a metal, glass material, a semiconductor wafer or the like to cleaning processing to remove organic contaminants stuck to a surface of the substance, oxide film formation processing to form an oxide film on a surface of the substance, etching processing or the like, for example, various processing methods using electron beam processing, UV processing, specific processing using a process gas or the like are known.

However, there are many cases in which a single substance to be processed needs to be subjected to a plurality of such processing steps. In such a case, each of the processing steps is carried out separately using a different processing device of the processing devices having different processing conditions such as light source type and processing chamber atmosphere to one another. The substance thus must be moved from device to device, and therefore, the moving operation thereof is not only troublesome, but moreover there is a risk of the substance being contaminated while being moved, thus destroying the effects of the processing.

SUMMARY OF THE INVENTION

This invention provides a processing device allowing a plurality of types of processing including electron beam processing to be carried out on a substance disposed in a processing chamber, and processing methods that use such a processing device and allow prescribed processing to be carried out in an advantageous way, and in the processing methods, such a processing device is used, and by adjusting the pressure in the processing chamber, electron beam processing, UV processing and specific processing using the process gas can be carried out either separately or simultaneously.

With the foregoing in view, it is an object of the present invention to provide a processing device allowing a plurality of types of processing including electron beam processing to be carried out on a substance to be processed disposed in a processing chamber.

Moreover, another object of the present invention is to provide processing methods that use such a processing device and allow prescribed processing to be carried out on a substance to be processed in an advantageous way.

The processing device of the present invention is characterized by comprising a processing chamber provided with a support member for supporting a substance to be processed, an electron beam source that is provided in the processing chamber and emits an electron beam toward the substance to be processed supported by the support member, and an emission gas supply system that is provided in the processing chamber and supplies an emission gas that emits UV light upon receiving an electron beam.

In the above-mentioned processing device, the emission gas is preferably at least one selected from helium, neon, argon, krypton, xenon and nitrogen.

Moreover, in the above-mentioned processing device, it is preferable for a low pressure system that reduces the pressure in the processing chamber to be provided in the processing chamber.

Moreover, in the above-mentioned processing device, it is preferable for detection means that detects the UV dose and/or the electron beam dose to be provided in the processing chamber.

Moreover, in the above-mentioned processing device, a process gas supply system that supplies a process gas is preferably provided in the processing chamber, wherein the process gas is preferably one selected from cleaning gases, etching gases and gases for film deposition.

A processing method of the present invention is characterized by using a processing device comprising a processing chamber that is provided with an electron beam source, and comprising the steps of: supplying an emission gas into the processing chamber with a substance disposed therein, and carrying out UV processing on the substance to be processed using UV light generated by the emission gas received an electron beam from the electron beam source.

The processing method of the present invention is characterized by using a processing device comprising a processing chamber that is provided with an electron beam source, and comprises the steps of: supplying a process gas into the processing chamber with a substance disposed therein, and carrying out specific processing on the substance to be processed using the process gas received an electron beam from the electron beam source.

The processing method of the present invention characterized by using a processing device comprising a processing chamber that is provided with an electron beam source, and comprises the steps of: supplying an emission gas and a process gas into the processing chamber with a substance disposed therein, and simultaneously carrying out UV processing on the substance to be processed using UV light generated by the emission gas received an electron beam from the electron beam source, and specific processing on the substance to be processed using the process gas received an electron beam from the electron beam source.

The processing method of the present invention characterized by using a processing device comprising a processing chamber that is provided with an electron beam source, and comprises the steps of: supplying an emission gas and/or a process gas into the processing chamber with a substance disposed therein while operating the electron beam source, and adjusting the pressure in the processing chamber, thus simultaneously carrying out electron beam processing on the substance to be processed, and UV processing on the substance to be processed using UV light generated by the emission gas received an electron beam from the electron beam source and/or specific processing on the substance to be processed using the process gas received an electron beam from the electron beam source.

According to the processing device of the present invention, the emission gas supplied into the processing chamber emits UV light upon receiving an electron beam, and this UV light is irradiated directly onto the substance to be processed disposed in the processing chamber, thus allowing desired UV processing to be carried out with high efficiency.

When a low pressure system is provided in the processing chamber, then by creating a reduced pressure state in the processing chamber, the electron beam emitted from the electron beam source can be made to spread sufficiently, thus allowing electron beam processing to be carried out on the substance to be processed with high efficiency.

Moreover, by adjusting the pressure in the processing chamber using the low pressure system or the like, the electron beam dose and the UV dose can be adjusted, allowing UV processing and electron beam processing to be carried out either simultaneously or consecutively in the same processing chamber without moving the substance to be processed.

Moreover, when detection means that detects the UV dose and/or the electron beam dose is provided in the processing chamber, then the pressure in the processing chamber and/or the current supplied to the electron beam source can be controlled in accordance with the measured UV dose and/or electron beam dose, thus allowing desired processing to be carried out reliably.

According to the processing methods of the present invention, by using the above-mentioned processing device, electron beam processing, UV processing and specific processing using a process gas can be carried out on a substance to be processed either separately or simultaneously, and moreover with high efficiency.

Moreover, when a plurality of types of processing are to be carried out on the substance to be processed, the different types of processing can be carried out either simultaneously or consecutively without moving the substance to be processed, and hence the processing time can be reduced and advantageous processing results can be obtained.

EXPLANATION OF SYMBOLS

Figure 1:
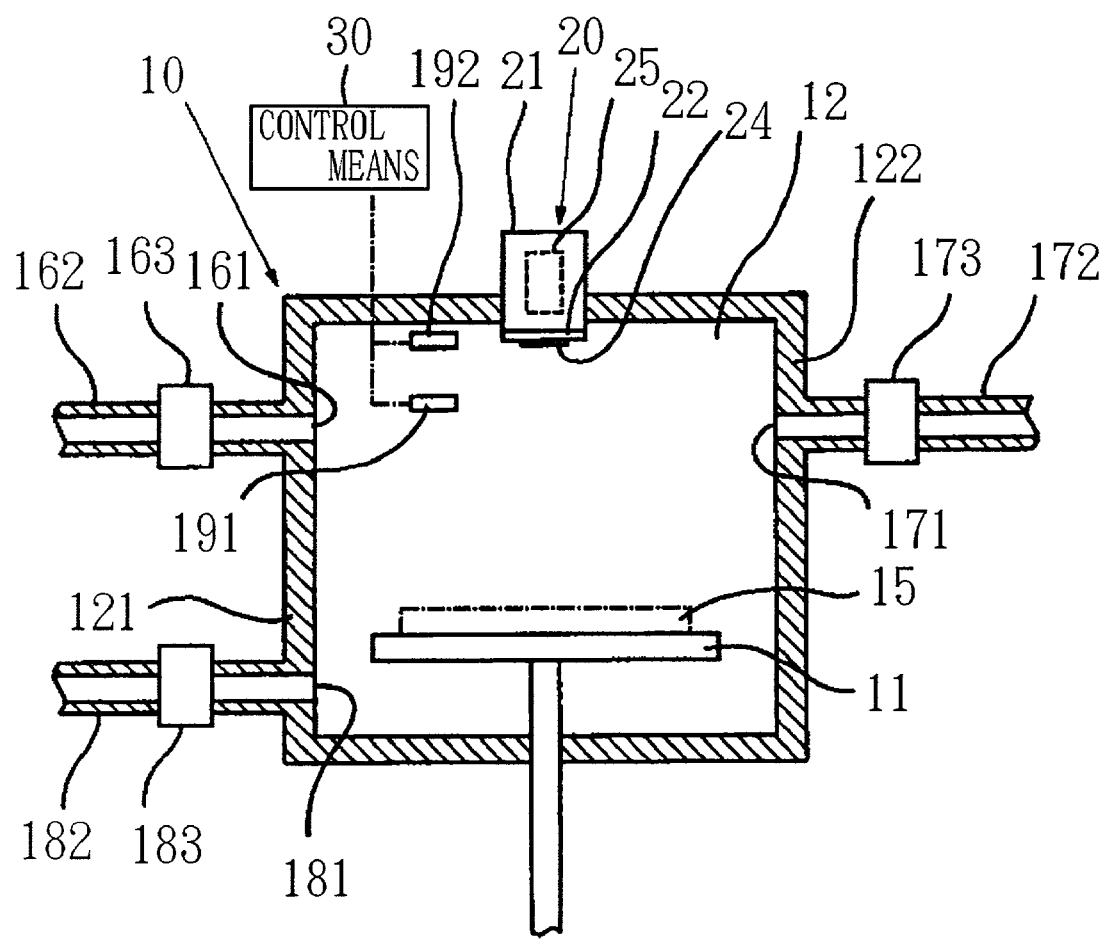
FIG. 1 is an explanatory cross-sectional view showing an example of the constitution of the processing device of the present invention.

10 Processing device
11 Sample platform (supporting member)
12 Processing chamber
121, 122 Side wall
15 Substance
161 Emission gas supply inlet
162 Emission gas supply line
163 Flow rate adjusting mechanism
171 Process gas supply inlet
172 Process gas supply line
173 Flow rate adjusting mechanism
181 Exhaust outlet
182 Exhaust line
183 Low pressure adjusting mechanism
191 Electron beam dose detection means
192 UV dose detection means
20 Electron beam tube
21 Vacuum vessel
22 Cover member
24 Electron beam emission window
25 Electron beam generator
30 Control means

DESCRIPTION OF THE PREFERRED EMBODIMENTS

FIG. 1 is an explanatory cross-sectional view showing an example of the constitution of the processing device of the present invention.

The processing device 10 has an airtightly constructed processing chamber 12. A sample platform 11 which is a support member that supports a substance 15 to be processed on an upper surface thereof is provided in a lower part of the processing chamber 12, and an electron beam source comprising, for example, an electron beam tube 20 having an electron beam emission window 24 is provided in an upper part of the processing chamber 12 so as to face the substance 15.

An emission gas supply inlet 161 is formed in a side wall 121 of the processing chamber 12. An emission gas supply system for supplying an emission gas, which emits UV light upon receiving an electron beam into a space below the electron beam tube 20 (hereinafter referred to as the 'reaction space'), is attached to the emission gas supply inlet 161.

The emission gas supply system comprises an emission gas supply line 162 that is connected to the emission gas supply inlet 161, an emission gas supply source (not shown in FIG. 1) that is positioned outside the processing chamber 12 and is connected to the emission gas supply line 162, and a flow rate adjusting mechanism 163 that is provided in the emission gas supply line 162 and adjusts the amount of the emission gas supplied.

The emission gas may be any gas that emits UV light upon receiving an electron beam. For example, one or more selected from helium, neon, argon, krypton, xenon and nitrogen may be used. When helium gas or neon gas is used, UV light of wavelength less than 100 nm is obtained.

Moreover, a process gas supply inlet 171 is formed in another side wall 122 of the processing chamber 12. A process gas supply system for supplying a process gas into the reaction space is attached to the process gas supply inlet 171.

The process gas supply system comprises a process gas supply line 172 that is connected to the process gas supply inlet 171, a process gas supply source (not shown in FIG. 1) that is positioned outside the processing chamber 12 and is connected to the process gas supply line 172, and a flow rate adjusting mechanism 173 that is provided in the process gas supply line 172 and adjusts the amount of the process gas supplied.

Here 'process gas' means a gas that is activated or decomposed upon receiving an electron beam to produce active species, wherein a substance 15 is subjected to specific processing such as cleaning, etching or film deposition by the active species. Here 'specific processing' includes processing other than electron beam processing and UV processing.

The process gas is selected in accordance with the type of specific processing desired, and may be, for example, one selected from cleaning gases, etching gases and gases for film deposition.

Specific examples of cleaning gases include oxygen gas, hydrogen gas or the like.

Specific examples of etching gases include chlorine, fluorine, bromine and halogen gases containing compounds thereof, $CF_4$, $CHF_3$, $CCl_4$, $CHCl_3$ or the like.

Specific examples of gases for film deposition include dichlorosilane and ammonia mixture, $SiH_4$, $SiH_2Cl_2$ or $SiCl_4$.

Moreover, in the processing device 10, an exhaust outlet 181 is formed in the side wall 121 of the processing chamber 12 at a height below that at which the substance 15 is supported, and a low pressure system is attached to the exhaust outlet 181.

The low pressure system comprises an exhaust line 182 that is connected to the exhaust outlet 181, pressure reduction means (not shown in FIG. 1) that is positioned outside the processing chamber 12 and is connected to the exhaust line 182, and a low pressure adjusting mechanism 183 that is provided in the exhaust line 182.

Electron beam dose detection means 191 that detects the electron beam dose and UV dose detection means 192 that detects the UV dose are provided in an upper part of the processing chamber 12 in the processing device 10. Data signals on the electron beam dose and the UV dose are sent from these detection means 191 and 192 to control means 30.

Scintillators each comprising a silicon photodiode or the like can be used as these detection means 191 and 192, and by means of these scintillators the electron beam dose and the UV dose can be detected separately.

The electron beam tube 20 that makes up the electron beam source comprises, for example, a vacuum vessel 21 provided with a cover member 22 that closes up an opening on a front side thereof (which is at the bottom in FIG. 1), and an electron beam generator 25 provided inside the vacuum vessel 21. The electron beam emission window 24 is formed in the cover member 22 and is positioned such as to face out onto the reaction space of the processing chamber 12. The electron beam generated by the electron beam generator 25 passes through the electron beam emission window 24.

In the case of an electron beam tube 20 having an electron beam generator 25 as described above, thermal electrons are generated by supplying a current, and these thermal electrons are pulled out in a forward direction by the action of an electric-field-forming electrode (not shown in FIG. 1), and are thus emitted from the electron beam emission window 24 of the vacuum vessel 21 as an electron beam.

A plurality of types of processing can be carried out on the substance 15 using the device described above, as follows:

(1) Electron Beam Processing

The low pressure system is operated to put the inside of the processing chamber 12 into a certain fixed reduced pressure state, and then the electron beam tube 20 is operated, whereupon an electron beam spreads from the electron beam tube 20 and is directly irradiated onto the substance 15. Electron beam processing is thus carried out on the substance 15. Moreover, because the inside of the processing chamber 12 is put into a reduced pressure state, the electron beam from the electron beam tube 20 is irradiated onto the substance 15 with sufficient intensity, and hence a high processing efficiency is obtained.

For example, under conditions of a distance of 60 mm between the emission window 24 of the electron beam tube 20 and the substance 15, a pressure in the processing chamber 12 of 13.3 Pa, and an acceleration voltage of the electron beam tube 20 of 50 kV, the electron beam dose on the substance 15 per unit time can be made to be 10 $\mu C/(cm^2 \cdot sec)$. In the case, for example, of a resist film of thickness 10 μm applied onto a disk-shaped silicon wafer of diameter 150 mm, the desired electron beam processing can be carried out in a processing time of 40 sec.

(2) UV Processing

An emission gas is supplied in from the emission gas supply system, and the flow rate adjusting mechanism 163 is used to create an emission gas atmosphere of a certain fixed pressure in the processing chamber 12. The electron beam tube 20 is then operated, whereupon the emission gas is excited by the electron beam from the electron beam tube 20 in the reaction space and emits UV light. UV processing is thus carried out on the substance 15 by means of this UV light.

For example, under conditions of a distance of 60 mm between the emission window 24 of the electron beam tube 20 and the substance 15, xenon gas as the emission gas, a pressure in the processing chamber 12 of 46.6 Pa, and an acceleration voltage of the electron beam tube 20 of 50 kV, the UV dose on the substance 15 per unit time can be made to be 0.5 $mW/(cm^2 \cdot sec)$. For example, UV processing can be carried out on a UV resist film of thickness 1 μm on a disk-shaped silicon wafer of diameter 150 mm.

(3) Specific Processing

A process gas is supplied in from the process gas supply system, and the flow rate adjusting mechanism 173 is used to create a process gas atmosphere of a certain fixed pressure in the processing chamber 12. The electron beam tube 20 is then operated, whereupon the process gas is activated or decomposed by the electron beam from the electron beam tube 20 to produce active species. Specific processing is carried out on the substance 15 by means of the active species.

Specifically, if, for example, an etching gas containing a compound of a halogen such as fluorine, bromine or chlorine is used as the process gas, then upon receiving the electron beam from the electron beam tube 20 the halogen compound produces halogen ions or halogen compound ions. Etching of a silicon wafer or the like is thus carried out by means of these ions as active species.

For example, under conditions of a distance of 60 mm between the emission window 24 of the electron beam tube 20 and the substance 15, a pressure in the processing chamber 12 of 27 Pa, and an acceleration voltage of the electron beam tube 20 of 50 kV, etching can be carried out on a silicon film of thickness 0.1 μm on a disk-shaped silicon wafer of diameter 150 mm.

Moreover, when, for example, a gas for film deposition is used as the process gas, then upon receiving the electron beam from the electron beam tube 20 the gas for film deposition is ionized to produce active species. Film deposition is thus carried out on the substance 15 by means of the active species.

For example, under conditions of a distance of 60 mm between the emission window 24 of the electron beam tube 20 and the substance 15, a dichlorosilane and ammonia mixture as the process gas, a pressure in the processing chamber 12 of 66 Pa, and an acceleration voltage of the electron beam tube 20 of 50 kV, a silicon nitride ($Si_3N_4$) film of thickness 0.2 μm can be formed on the surface of a silicon wafer in a processing time of 1400 sec.

(4) Concurrent Processing in Which UV Processing and Specific Processing are Carried out Simultaneously An emission gas is supplied in from the emission gas supply system and a process gas is supplied in from the process gas supply system, thus creating a gas atmosphere of a certain fixed pressure in the processing chamber 12. The electron beam tube 20 is then operated, whereupon the emission gas is excited by part of the electron beam from the electron beam tube 20 and emits UV light, and the process gas is activated or decomposed by another part of the electron beam to produce active species. Concurrent processing in which UV processing by the UV light and specific processing by the active species are carried out simultaneously is thus carried out on the substance 15.

Specifically, when, for example, argon gas is used as the emission gas and oxygen gas is used as the process gas, then the argon gas is excited by part of the electron beam and emits UV light, and hence UV processing is carried out by means of part of this UV light, and moreover another part of the UV light reacts with part of the oxygen gas to produce ozone, and hence cleaning processing (specific processing) is carried out by means of this ozone. Furthermore, another part of the oxygen gas receives another part of the electron beam to produce ozone, and cleaning processing (specific processing) is also carried out on the substance 15 by means of this ozone.

For example, under conditions of a distance of 60 mm between the emission window 24 of the electron beam tube 20 and the substance 15, an argon gas pressure of 53.2 Pa, an oxygen gas pressure of 133 Pa, and an acceleration voltage of the electron beam tube 20 of 50 kV, concurrent processing in which UV processing and cleaning processing (specific processing) are carried out simultaneously can be carried out on organic contaminants on a disk-shaped silicon wafer of diameter 150 mm in a processing time of 50 sec.

(5) Concurrent Processing in Which UV Processing or Specific Processing is Carried out Simultaneously with Electron Beam Processing An emission gas is supplied in from the emission gas supply system, and if necessary the low pressure system is operated to adjust the pressure of the emission gas in the processing chamber 12. Under the resulting state in which there is an emission gas atmosphere of a certain fixed pressure in the processing chamber 12, the electron beam tube 20 is then operated. The conditions can be made such that part of the electron beam from the electron beam tube 20 is irradiated directly onto the substance 15.

Figure 2:
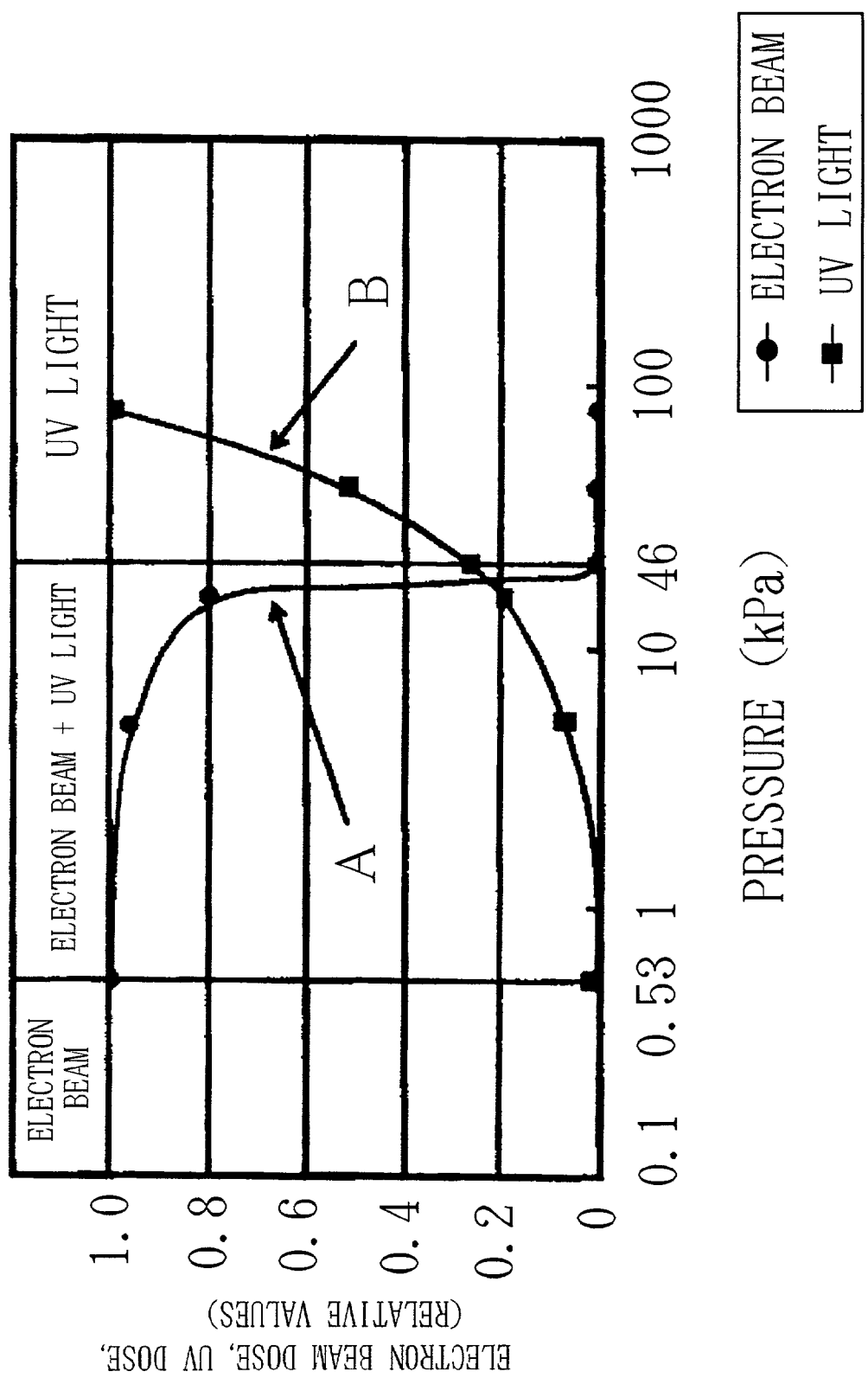
FIG. 2 is a characteristic curve diagram showing the relationship between the pressure in the processing chamber and the electron beam dose and UV dose in the processing chamber when xenon is used as the emission gas.

Specifically, as shown in FIG. 2, if the pressure of xenon gas (the emission gas) in the processing chamber 12 is low, for example less than 0.53 kPa, then the substance 15 is irradiated with only the electron beam, with the UV dose being essentially zero. When operation of the electron beam tube 20 is now continued but the pressure of the xenon gas (the emission gas) in the processing chamber 12 is gradually raised from the low pressure state, then, as shown by curve A in FIG. 2, the electron beam dose on the substance 15 gradually drops after the pressure goes past 0.53 kPa, and then drops suddenly at about 10 kPa, before becoming essentially zero at about 46 kPa; the UV dose on the substance 15, on the other hand, increases greatly above 0.53 kPa, as shown by curve B in FIG. 2. The reason for the above is that the xenon gas absorbs the electron beam and emits UV light; once the pressure of xenon gas in the processing chamber 12 is above 46 kPa, only UV light reaches the substance 15. In FIG. 2, the UV dose and the electron beam dose are shown as values relative to the respective peak values thereof.

Figure 3:
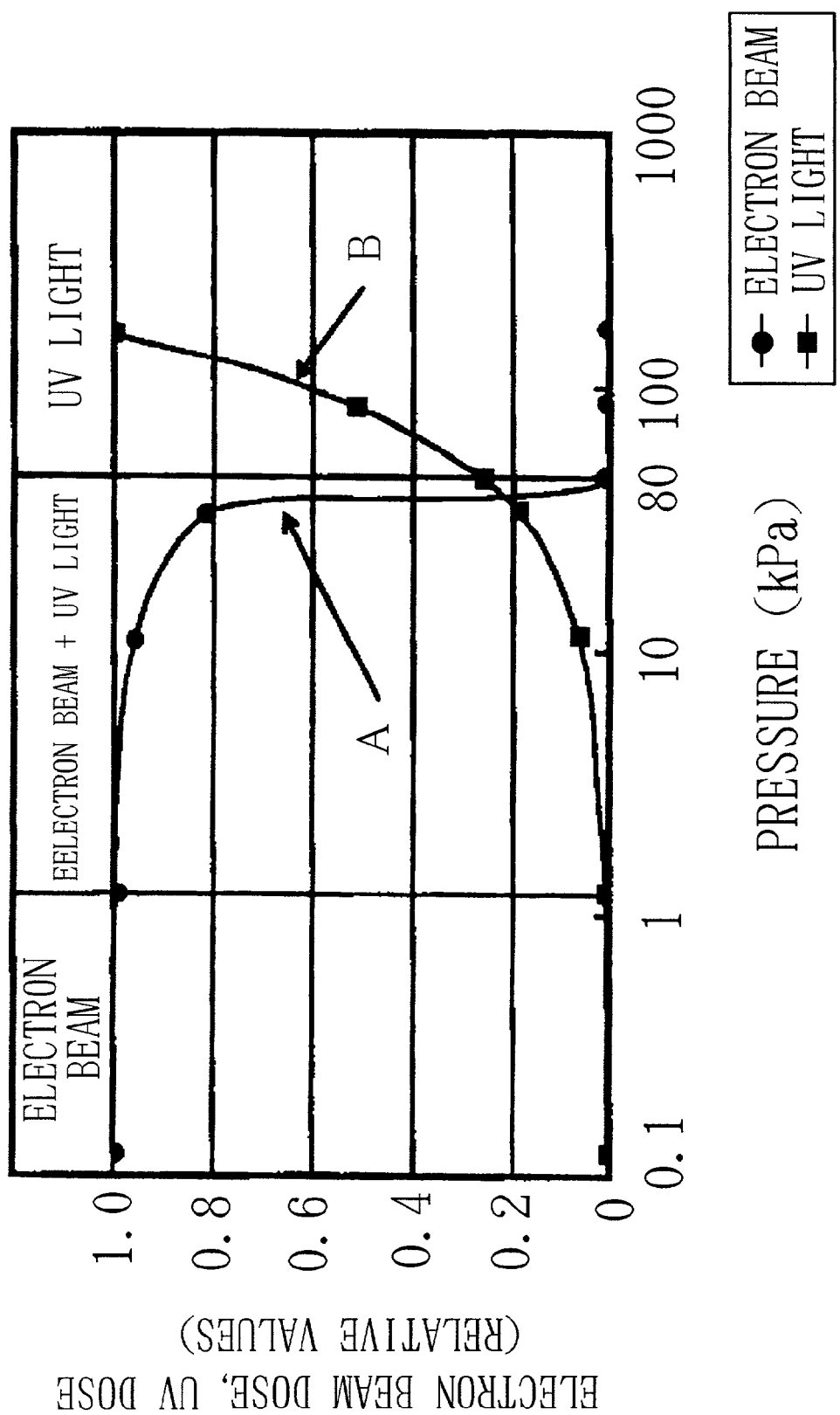
FIG. 3 is a characteristic curve diagram showing the relationship between the pressure in the processing chamber and the electron beam dose and UV dose in the processing chamber when argon is used as the emission gas.

Moreover, FIG. 3 is a characteristic curve diagram like FIG. 2, only for the case that argon gas is used as the emission gas. In this case, the pressure range of argon in the processing chamber 12 for which the substance 15 is irradiated with both the electron beam and UV light is about 1 to 80 kPa.

As described above, by adjusting the pressure of the emission gas in the processing chamber 12, a pressure state in which the substance 15 is irradiated with only one of the electron beam and UV light, or a pressure state in which the substance 15 is irradiated with both the electron beam and UV light, can be realized. By creating a pressure state in which the substance 15 is irradiated with both the electron beam and UV light, concurrent processing in which electron beam processing by the electron beam and UV processing by the UV light are carried out simultaneously can be carried out on the substance 15.

For example, under conditions of a distance of 60 mm between the emission window 24 of the electron beam tube 20 and the substance 15, xenon gas as the emission gas, a pressure in the processing chamber 12 of 13.3 kPa, and an acceleration voltage of the electron beam tube 20 of 50 kV, the electron beam dose on the substance 15 per unit time can be made to be 5 $\mu C/(cm^2 \cdot sec)$, and the UV dose on the substance 15 per unit time 5 $\mu W/(cm^2 \cdot sec)$. In the case, for example, of a resist film of thickness 10 $\mu m$ on a disk-shaped silicon wafer of diameter 150 mm, concurrent processing in which UV processing and electron beam processing are carried out simultaneously can be carried out in a processing time of 1600 sec.

According to this processing method, a surface layer part of the substance 15 can be processed by UV processing, and at the same time, because the electron beam penetrates into the substance 15, the substance 15 can be processed by the electron beam to a large processing depth, all in a single processing chamber 12. Prescribed processing can thus be carried out with a high processing efficiency.

Moreover, when the UV dose and the electron beam dose in the processing chamber 12 are measured using the detection means 191 and 192, then it becomes possible to accurately control the UV dose and the electron beam dose in the processing chamber 12 by adjusting, for example, the intensity of the electron beam and the pressure of the gas. The extents of the UV processing and the electron beam processing can thus be adjusted.

Moreover, when a process gas is used instead of the emission gas, then, similarly, concurrent processing in which specific processing and electron beam processing are carried out simultaneously can be carried out on the substance 15.

(6) Consecutive Execution of Different Types of Processing

The types of processing in (1) to (5) above can be carried out consecutively in the same processing chamber 12 without moving the substance 15. A description will be given below of an example of such consecutive processing in which first processing consisting of electron beam processing is first carried out, and then second processing consisting of concurrent processing in which UV processing and specific processing are carried out simultaneously is carried out.

The low pressure system is operated to put the inside of the processing chamber 12 into a certain fixed reduced pressure state, and then the electron beam tube 20 is operated, whereupon an electron beam spreads from the electron beam tube 20 and is irradiated onto the substance 15. First processing consisting of electron beam processing is thus carried out on the substance 15.

Next, supply of an emission gas from the emission gas supply system and supply of a process gas from the process gas supply system are both commenced, thus creating a gas atmosphere of a certain fixed pressure in the processing chamber 12. The electron beam tube 20 is then operated, whereupon the emission gas is excited by part of the electron beam from the electron beam tube 20 and emits UV light, and the process gas is activated or decomposed by another part of the electron beam to produce active species. Concurrent processing in which UV processing by the UV light and specific processing by the active species are carried out simultaneously is thus carried out on the substance 15.

Specifically, when, for example, argon gas is used as the emission gas and oxygen gas is used as the processing gas, then UV processing is carried out by means of part of the UV light emitted by the argon gas, and moreover another part of the UV light reacts with part of the oxygen gas to produce ozone, and hence cleaning processing (specific processing) is carried out by means of this ozone. Furthermore, another part of the oxygen gas receives part of the electron beam to produce ozone, and cleaning processing (specific processing) is also carried out on the article 15 by means of this ozone.

For example, under conditions of a distance of 60 mm between the emission window 24 of the electron beam tube 20 and the substance 15, an acceleration voltage of the electron beam tube 20 of 50 kV, a pressure in the processing chamber 12 of 13.3 Pa during the first processing, and an argon gas pressure of 53.2 Pa and an oxygen gas pressure of 133 Pa during the second processing, first processing consisting of electron beam processing, and second processing consisting of concurrent processing in which UV processing and cleaning processing (specific processing) are carried out simultaneously, can be carried out consecutively on a film of thickness 10 μm on a disk-shaped silicon wafer of diameter 150 mm.

According to this processing method, the substance 15 can be processed to a large processing depth through the first processing consisting of electron beam processing, and after this second processing consisting of ozone processing and UV processing can be carried out, all in a single processing chamber 12. Prescribed processing can thus be carried out with a high processing efficiency, without it being necessary to move the substance 15.

When consecutive processing is carried out on the substance 15, the types of processing and the number and order thereof can be selected as appropriate without limitation.

As described above, according to the processing device 10, because the processing device 10 comprises an electron beam tube 20, an emission gas supply system, a processing gas supply system and a low pressure system, a plurality of types of processing can be carried out in a single processing chamber 12 without moving the substance 15 to be processed. Specifically, by adjusting the pressure in the processing chamber 12 using the emission gas supply system, the process gas supply system and the low pressure system, a desired pressure state, for example a pressure state in which the substance 15 is irradiated with only one of the electron beam and UV light or a pressure state in which the substance 15 is irradiated with both the electron beam and UV light, can be obtained. As a result, electron beam processing, UV processing, and specific processing using a processing gas, can be carried out either separately or simultaneously.

Specific embodiments of the present invention have been described above. However, the present invention is not limited to these embodiments, with it being possible to make various changes to the specific constitution of each of the constituent parts of the processing device.

(1) The support member that supports the substance to be processed may be given any constitution appropriate for the substance to be processed. Moreover, a rotating mechanism, a heating mechanism, a raising/lowering mechanism and so on may be provided. Furthermore, a heating mechanism that heats the processing chamber itself may be provided.

(2) The electron beam source may be anything that emits an electron beam and is not limited to being an electron beam tube.

(3) It is not necessary to provide both the UV dose detection means and the electron beam dose detection means. Depending on the processing to be carried out on the substance to be processed, a constitution in which only one of the detection means is provided may be used.

According to the processing device of the present invention, an emission gas supplied into the processing chamber emits UV light upon receiving an electron beam, and this UV light is irradiated directly onto a substance to be processed disposed in the processing chamber, thus allowing desired UV processing to be carried out with high efficiency.

When a low pressure system is provided in the processing chamber, then by creating a reduced pressure state in the processing chamber, the electron beam emitted from the electron beam source can be made to spread sufficiently, thus allowing electron beam processing to be carried out on the substance to be processed with high efficiency.

Moreover, by adjusting the pressure in the processing chamber using the low pressure system or the like, the electron beam dose and the UV dose can be adjusted, allowing UV processing and electron beam processing to be carried out either simultaneously or consecutively in the same processing chamber without moving the substance to be processed.

Moreover, when detection means that detects the UV dose and/or the electron beam dose is provided in the processing chamber, then the pressure in the processing chamber and/or the current supplied to the electron beam source can be controlled in accordance with the measured UV dose and/or electron beam dose in the processing chamber, thus allowing desired processing to be carried out reliably.

According to the processing methods of the present invention, by using the above-mentioned processing device, electron beam processing, UV processing and specific processing using a process gas can be carried out on a substance to be processed either separately or simultaneously, and moreover with high efficiency.

Moreover, when a plurality of types of processing are to be carried out on the substance to be processed, the different types of processing can be carried out either simultaneously or consecutively without moving the substance to be processed, and hence the processing time can be reduced and advantageous processing results can be obtained.

What is claimed is:

1. A processing device, comprising:
   a single processing chamber provided with a support member for supporting a substance to be processed;
   an electron beam source that is provided in said processing chamber and emits an electron beam toward the substance to be processed supported by said support member;
   an emission gas supply system having an emission gas supply line to said processing chamber and which supplies an emission gas that emits UV light upon receiving an electron beam,
   a process gas supply system having a process gas supply line to said processing chamber and which supplies a process gas, said process gas supply line being separate from said emission gas supply line; and a low pressure system that reduces the pressure in said processing chamber and that is attached to an exhaust outlet which is formed in the processing chamber at a height below a sample platform of the support member which supports the substance to be processed against a downstream flow of the emission gas or the processing gas, wherein the substance to be processed is processed in the single processing chamber, by a processing selected from the following types of processing A to F:

A: UV processing,
B: specific processing,
C: UV processing and specific processing,
D: electron beam processing and UV processing,
E: electron beam processing and specific processing, or
F: electron beam processing, UV processing and specific processing, wherein the electron beam processing is carried out by operating the low pressure system to put an inside of the processing chamber into a certain reduced pressure state, and in this reduced pressure state directly irradiating an electron beam from the electron beam source onto the substance to be processed in order to carry out electron beam processing on the substance to be processed, wherein the UV processing is carried out by creating an emission gas atmosphere of a certain pressure in the processing chamber, and in this emission gas atmosphere operating the electron beam source such that the emission gas is excited upon receiving an electron beam to emit UV light, and processing is carried out on the substance to be processed by this emitted UV light, and wherein the specific processing is carried out by creating a processing gas atmosphere of a certain pressure in the processing chamber, and in this processing gas atmosphere operating the electron beam source such that the processing gas is activated or decomposed upon receiving an electron beam to produce active species, and processing is carried out on the substance to be processed by the active species.

\* \* \* \* \*